US011608435B2

(12) United States Patent
Fujii et al.

(10) Patent No.: US 11,608,435 B2
(45) Date of Patent: Mar. 21, 2023

(54) EPOXY RESIN COMPOSITION, ELECTRONIC COMPONENT MOUNTING STRUCTURE, AND METHOD FOR PRODUCING THE SAME

(71) Applicant: NAGASE CHEMTEX CORPORATION, Osaka (JP)

(72) Inventors: Yasuhito Fujii, Tatsuno (JP); Katsushi Kan, Tatsuno (JP); Yosuke Oi, Tatsuno (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 256 days.

(21) Appl. No.: 16/610,992

(22) PCT Filed: May 30, 2018

(86) PCT No.: PCT/JP2018/020706
§ 371 (c)(1),
(2) Date: Nov. 5, 2019

(87) PCT Pub. No.: WO2018/225599
PCT Pub. Date: Dec. 13, 2018

(65) Prior Publication Data
US 2020/0172724 A1 Jun. 4, 2020

(30) Foreign Application Priority Data
Jun. 9, 2017 (JP) .............................. JP2017-114687

(51) Int. Cl.
| | | |
|---|---|---|
| H01L 21/56 | (2006.01) | |
| H01L 23/29 | (2006.01) | |
| C08L 63/00 | (2006.01) | |
| C09J 163/00 | (2006.01) | |
| C08K 3/36 | (2006.01) | |
| C08K 7/26 | (2006.01) | |
| C08L 63/04 | (2006.01) | |
| B29C 43/00 | (2006.01) | |
| B29K 63/00 | (2006.01) | |
| C08G 59/42 | (2006.01) | |
| C08K 5/18 | (2006.01) | |

(52) U.S. Cl.
CPC ............ *C08L 63/04* (2013.01); *B29C 43/003* (2013.01); *C08K 3/36* (2013.01); *C08K 7/26* (2013.01); *C08L 63/00* (2013.01); *C09J 163/00* (2013.01); *H01L 21/56* (2013.01); *H01L 21/563* (2013.01); *H01L 23/295* (2013.01); *B29K 2063/00* (2013.01); *C08G 59/4238* (2013.01); *C08K 5/18* (2013.01); *C08K 2201/003* (2013.01); *C08L 2201/08* (2013.01); *C08L 2203/206* (2013.01)

(58) Field of Classification Search
CPC .......... C08L 63/00; C09J 163/00; C08K 3/36; C08K 7/26; C08K 2201/003; C08K 2201/005; H01L 21/56; H01L 21/563; H01L 23/295

USPC ........... 438/25, 26, 106, 112, 124, 126, 127; 523/443, 466
See application file for complete search history.

(56) References Cited

U.S. PATENT DOCUMENTS

| | | | |
|---|---|---|---|
| 4,615,741 A | | 10/1986 | Kobayashi et al. |
| 6,083,774 A | * | 7/2000 | Shiobara ............... H01L 21/563 438/108 |
| 6,303,223 B1 | * | 10/2001 | Kinose .................. C04B 14/062 106/490 |
| 2004/0097632 A1 | | 5/2004 | Akizuki et al. |
| 2004/0124547 A1 | | 7/2004 | Jobetto |
| 2005/0224767 A1 | | 10/2005 | Japp et al. |
| 2009/0250803 A1 | * | 10/2009 | Arai ........................ H01L 24/19 257/E23.18 |
| 2010/0297439 A1 | | 11/2010 | Takayama et al. |
| 2011/0202896 A1 | | 8/2011 | Scanlan et al. |
| 2013/0237055 A1 | | 9/2013 | Funaya et al. |
| 2013/0277867 A1 | | 10/2013 | Yuzuriha |

(Continued)

FOREIGN PATENT DOCUMENTS

| | | |
|---|---|---|
| CN | 1510745 A | 7/2004 |
| CN | 2004-325861 A | 11/2004 |

(Continued)

OTHER PUBLICATIONS

Machine translation of JP-09296073-A (no date).*
Machine translation of JP-2002047395-A (no date).*
International Search Report for PCT/JP2018/020706, dated Jul. 31, 2018.
Office Action dated Dec. 3, 2021 from the Chinese Patent Office in Chinese Application No. 201880033290.6.

(Continued)

*Primary Examiner* — Michael J Feely
(74) *Attorney, Agent, or Firm* — Sughrue Mion, PLLC

(57) ABSTRACT

To provide an epoxy resin composition capable of forming a polished surface with high flatness when polished after curing, and a method for producing an electronic component mounting structure having a polished surface with high flatness, the polished surface obtained by polishing the surface of an encapsulation body. Disclosed are an epoxy resin composition, an electronic component mounting structure including the epoxy resin composition, and a method for producing the electronic component mounting structure, wherein: the epoxy resin composition includes a fused silica possibly containing hollow particles, and a curing agent; on a polished surface obtained by polishing a cured product of the epoxy resin composition, the number of pores having a diameter of more than 5 μm observed within a 25-mm² area is one or less, the pores derived from cross sections of the hollow particles; and the polished surface is coated with a coating material.

9 Claims, 3 Drawing Sheets

(56) References Cited

U.S. PATENT DOCUMENTS

| | | | | |
|---|---|---|---|---|
| 2013/0280826 A1* | 10/2013 | Scanlan | ................ | H01L 24/05 438/15 |
| 2016/0260695 A1* | 9/2016 | Chung | ................ | H01L 21/6835 |
| 2018/0327595 A1 | 11/2018 | Fukuda et al. | | |
| 2020/0115554 A1 | 4/2020 | Fukuda et al. | | |

FOREIGN PATENT DOCUMENTS

| | | | | |
|---|---|---|---|---|
| CN | 102549732 A | 7/2012 | | |
| CN | 2013-173841 A | 9/2013 | | |
| CN | 103328531 A | 9/2013 | | |
| JP | H08-034608 A | 2/1996 | | |
| JP | 09296073 A | * 11/1997 | ............. | B29C 39/00 |
| JP | 2002047395 A | * 2/2002 | ............. | C08L 63/00 |
| JP | 2007-204510 A | 8/2007 | | |
| JP | 2008-130796 A | 6/2008 | | |
| JP | 2009-9110 A | 1/2009 | | |
| JP | 2013-528318 A | 7/2013 | | |
| JP | 2015-038197 A | 2/2015 | | |
| JP | 2017-095291 A | 6/2017 | | |
| WO | 2016/129541 A1 | 8/2016 | | |
| WO | 2017/086368 A1 | 5/2017 | | |

OTHER PUBLICATIONS

Office Action dated Sep. 29, 2021, issued by the Taiwanese Patent Office in Taiwanese application No. 107119454.

Office Action dated Mar. 15, 2022 from the Japanese Patent Office in JP Application No. 2019-523484.

Office Action dated Aug. 18, 2022, issued in Korean Application No. 10-2019-7032307.

Office Action dated Sep. 13, 2022, issued in Japanese Application No. 2019-523484.

* cited by examiner

EPOXY RESIN COMPOSITION, ELECTRONIC COMPONENT MOUNTING STRUCTURE, AND METHOD FOR PRODUCING THE SAME

CROSS REFERENCE TO RELATED APPLICATIONS

This application is a National Stage of International Application No. PCT/JP2018/020706 filed May 30, 2018, claiming priority based on Japanese Patent Application No. 2017-114687 filed Jun. 9, 2017.

TECHNICAL FIELD

The present invention relates to an epoxy resin composition, an electronic component mounting structure, and a method for producing the same.

BACKGROUND ART

With growing demand for smaller and thinner semiconductor products in recent years, attention has been drawn to packaging technologies known as panel level packaging (PLP) and wafer level packaging (WLP). Among PLP and WLP, fan-out panel level packaging (FOPLP) and fan-out wafer level packaging (FOWLP) can form a redistribution layer even outside a semiconductor chip or the like, and therefore, can make the mounting area larger as compared to the area of a semiconductor chip or the like. In FOPLP and FOWLP, which use no packaging substrate, the thickness becomes thinner as compared to those of the conventional semiconductor products, and moreover, the wiring length becomes shorter, which can realize a faster transmission speed.

For semiconductor encapsulation materials, which are required to be excellent in electrical insulating properties, heat resistance, and moisture resistance, a composition containing a curable epoxy resin and an inorganic material called filler is widely used. By increasing the filler content, the semiconductor encapsulation material can exhibit low thermal expansion coefficient.

In the case of reducing the thickness of a cured product of a semiconductor encapsulation material by grinding, the polished surface is required to have high flatness. Patent Literature 1 discloses a technique in which, after an electrically insulating resin layer is formed on a wafer of functional element and then covered with a resin layer called a sacrificial layer, the insulating resin layer and the sacrificial layer are ground or polished, thereby to obtain a flat surface. The sacrificial layer is removed later.

CITATION LIST

Patent Literature

[PTL 1] Japanese Patent Laid-Open No. 2013-528318

SUMMARY OF INVENTION

Technical Problem

As electronic devices are getting more sophisticated, high-density fine wiring is required in semiconductor products. The circuit line/space (L/S) of redistribution layers has already reached 5 µm/5 µm, which tends to be finer and finer. In an assembly method in which a redistribution layer is formed on a flat support, followed by flip-chip bonding and resin encapsulation, the wiring pattern is generally stable. On the other hand, in the case where after an electronic component like a semiconductor element is resin-encapsulated, and the encapsulation material is polished, a redistribution layer is formed on a polished surface, the polished surface is required to be highly flat so that a fine redistribution layer can be formed thereon. Even in an assembly method in which a redistribution layer is formed on a flat support, followed by flip-chip bonding and resin encapsulation, in the case where a redistribution layer is formed on both sides, the redistribution layer on the other side is formed after the encapsulation material surface is polished. Therefore, in this case also, the polished surface is required to be highly flat.

When polishing a cured product of a semiconductor encapsulation material, however, pores may be formed on the polished surface, resulting in rough surface. The roughness of the polished surface is presumably caused by, for example, filler dropping-off. Theoretically, the roughness derived from the filler can be reduced by reducing the particle size of the filler. However, the use of finer filler increases the viscosity of the semiconductor encapsulation material and thus lowers the workability. Therefore, the content cannot be increased, and the particle size cannot be reduced beyond a certain level. In short, it is difficult to reduce the roughness of the polished surface by controlling the particle size of the filler.

Solution to Problem

One aspect of the present invention relates to an epoxy resin composition including an epoxy resin, a fused silica possibly containing hollow particles, a curing agent and/or a curing accelerator, wherein on a polished surface obtained by polishing a cured product of the epoxy resin composition, the number of pores having a diameter of more than 5 µm observed within a 25-mm$^2$ area is one or less, the pores derived from cross sections of the hollow particles.

Another aspect of the present invention relates to an electronic component mounting structure including an electronic component or a substrate, and a cured product of an epoxy resin composition, the cured product encapsulating the electronic component or the substrate, wherein: the epoxy resin composition contains an epoxy resin, a fused silica possibly containing hollow particles, and a curing agent and/or a curing accelerator; the cured product has a polished surface; and on the polished surface, the number of pores having a diameter of more than 5 µm observed within a 25-mm$^2$ area is one or less, the pores derived from cross sections of the hollow particles.

Still another aspect of the present invention relates to a method of producing an electronic component mounting structure, the method including steps of: preparing an electronic component or a substrate, and the aforementioned epoxy resin composition; encapsulating the electronic component or the substrate with the epoxy resin composition, and curing the epoxy resin composition, to form an encapsulation body including the electronic component or the substrate and a cured product of the epoxy resin composition; polishing part of the cured product, to form a polished surface; and forming a redistribution layer on the polished surface.

Advantageous Effects of Invention

According to the present invention, it is possible to provide an epoxy resin composition capable of forming a polished surface with high flatness when polished after curing. Moreover, according to the present invention, it is possible to provide an electronic component mounting structure having a polished surface with high flatness.

DESCRIPTION OF EMBODIMENTS

Figure 1:
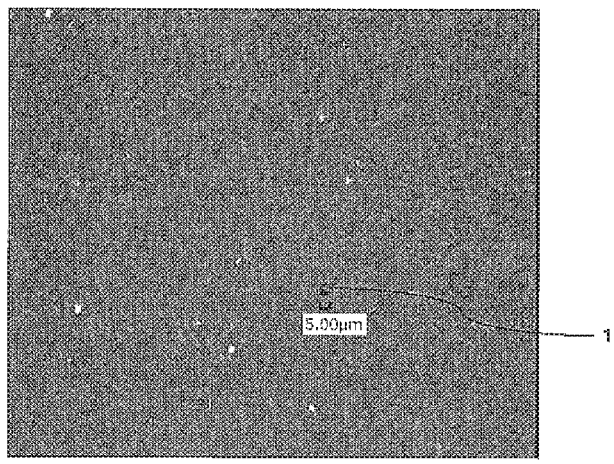
FIG. 1 An image of a polished surface obtained in Example 1, taken using an ultra-deep color 3D profile measuring microscope, showing pores derived from cross sections of hollow particles.

An epoxy resin composition according to an embodiment of the present invention includes an epoxy resin, a fused silica possibly containing hollow particles, and a curing agent and/or a curing accelerator. On a polished surface obtained by polishing a cured product of the epoxy resin composition, the number of pores having a diameter of more than 5 μm observed within a 25-mm$^2$ area, the pores derived from cross sections of the hollow particles, is one or less, preferably 0.1 or less, and more preferably, there are substantially no pores having a diameter of more than 5 μm. Such a polished surface has almost no microroughness, and therefore is suitable for, for example, forming thereon a film of a coating material for forming a redistribution layer. When a coating material is applied onto a polished surface with high flatness, the flatness follows to the film of the coating material, and the film surface also becomes highly flat.

The pores derived from cross sections of the hollow particles as used herein refer not to through-holes, but to dents derived from empty spaces inside the hollow particle. When the pore is not circular, the maximum diameter of the pore is regarded as the diameter of the pore.

The number of pores derived from cross sections of the hollow particles observed within a 25-mm$^2$ area on a polished surface of a cured product of the epoxy resin composition can be measured, for example, using an ultra-deep color 3D profile measuring microscope (e.g., VK-9510 available from Keyence Corporation). Specifically, it can be determined by, in randomly selected 10 areas each measuring 25 mm$^2$ on the polished surface, measuring the diameters and the number of the pores derived from cross sections of the hollow particles, and averaging the numbers of the pores having a predetermined size. The diameter or the maximum diameter of each pore may be measured using a similar instrument.

Spherical fused silica is produced, for example, by fusing pulverized silica powder in high temperature flames, which is then formed into spheres by means of surface tension. The entry of gas while fusing silica causes hollow particles with hollow interiors to be produced as a by-product. Thus, a cured product of the epoxy resin composition possibly contains hollow particles. When a cured product containing hollow particles is polished, pores derived from cross sections of the hollow particles appear on the polished surface. Due to the presence of such pores, microroughness is formed on the polished surface. Controlling the hollow particles, therefore, is an effective way to avoid formation of microroughness.

When measuring the number of the pores derived from cross sections of the hollow particles observed within a 25-mm$^2$ area on a polished surface of a cured product of the epoxy resin composition, a cured product prepared by thermally curing the epoxy resin composition, for example, at 150° C. for 1 hour is used. Prior to thermal curing at 150° C. for 1 hour, the epoxy resin composition may be heated at, for example, 100 to 125° C. for 10 to 20 min.

The polished surface may be formed by any method but is preferably formed by polishing a cured product until it has a region whose surface roughness (arithmetic average roughness: Ra) is 0.2 μm or less. The surface roughness can be determined by a measurement in a region without pores of larger than 1.5 μm in diameter. The surface roughness is determined as a line roughness along a sampling length of 100 μm according to JIS B0601 (1994), and can be measured, for example, using an ultra-deep color 3D profile measuring microscope (e.g., VK-9510 available from Keyence Corporation).

Epoxy resin compositions can be used as encapsulation materials for electronic components. Among various applications, epoxy resin compositions can be suitably used as materials for compression molding, the materials used as an encapsulation material for packaging like PLP and WLP. Note that the molding method is not limited to compression molding, and may be printing molding, transfer molding, or application molding using a dispenser or the like. Examples of such molding materials include a liquid epoxy resin composition, a semi-cured (so-called B stage) epoxy resin composition, an epoxy resin composition formed into a sheet, and an epoxy resin composition granulated into granules.

The coating material can be a material for forming a redistribution layer. In FOWLP in WLP and FOPLP in PLP, a fine redistribution layer is formed on a polished surface. When a material for forming a redistribution layer is applied on a highly flat polished surface having almost no microroughness, the flatness of the film surface of the material for forming a redistribution layer also becomes high. Therefore, a fine redistribution layer can be easily formed more accurately on the polished surface, and redistribution wiring disconnection can be made unlikely to occur.

The epoxy resin composition according to the present embodiment can be suitably used for encapsulating a large-area electronic component or substrate. The epoxy resin composition can be also suitably used as an encapsulation material (mold underfill material) when performing underfilling and overmolding in one single step on an electronic component or substrate with a semiconductor element or the like mounted thereon. In the present embodiment, the substrate means any of the following: a substrate provided with an electronic component, a group of electronic components, and an electronic component itself.

A large-area substrate can be used to form a package, for example, wafer level package (WLP) or panel level package (PLP). Among these, FOPLP and FOWLP are attracting attention in that a redistribution layer having a larger area can be formed. The large-area substrate is, for example, a wafer having a diameter of 200 mm (8 in) or more or 300 mm (12 in) or more, a panel or wafer having an area of 30,000 mm² or more, or a panel having a size of 300 mm square or more (e.g., 320 mm×320 mm), or 400 mm square or more (e.g., 410 mm×515 mm, 508 mm×610 mm, 500 mm×510 mm, 610 mm×457 mm). Per one side of the substrate, the area of a region encapsulated with the epoxy resin composition is, for example, 90% or more to the area of the substrate, and the encapsulation may be of single-sided or double-sided.

The substrate encompasses, in addition to a water and a panel, a glass substrate, a resin substrate, and a printed-circuit board, those provided with an electronic component. Examples of the wafer include a silicon wafer, a sapphire wafer, and a compound semiconductor wafer. Examples of the resin substrate include a bismaleimide-triazine substrate, a polyimide substrate, and a fluororesin substrate.

On a polished surface obtained by polishing a cured product of the epoxy resin composition, the number of pores having a diameter of more than 5 μm observed within a 25-mm² area, the pores derived from cross sections of the hollow particles, is one or less, preferably 0.1 or less, more preferably substantially zero. The number of pores having a diameter of more than 3 μm is preferably one or less, more preferably 0.1 or less, and most preferably, there are substantially no pores having a diameter of more than 3 μm. The number of pores having a diameter of more than 2 μm is preferably two or less, more preferably one or less, still more preferably 0.1 or less, and most preferably there are substantially no pores having a diameter of more than 2 μm. This eases the formation of a redistribution layer even finer than 2 μm/2 μm in circuit line/space (US), on the polished surface.

When no pores larger than 5 μm in diameter (or pores larger than 3 μm in diameter, or pores larger than 2 μm in diameter) are observed in randomly selected 10 areas each measuring 25 mm² on a polished surface obtained by curing an epoxy resin composition at 150° C. for 1 hour, the epoxy resin composition can be regarded as substantially containing no hollow particles having a hollow diameter of larger than 5 μm (or 3 μm or 2 μm).

Next, the electronic component mounting structure according to an embodiment of the present invention includes an electronic component or a substrate, and a cured product of an epoxy resin composition for encapsulating the electronic component or the substrate. The electronic component may be, for example, a device including a semiconductor chip, but is not particularly limited. The cured product of the epoxy resin composition has a polished surface.

On the polished surface, the arithmetic average roughness (Ra) is preferably 0.2 μm or less, more preferably 0.15 μm or less.

Next, a method of producing an electronic component mounting structure according to an embodiment of the present invention includes steps of: (i) preparing an electronic component or a substrate, and the aforementioned epoxy resin composition, (ii) encapsulating the electronic component or the substrate with the epoxy resin composition, and curing the epoxy resin composition, to form an encapsulation body including the electronic component or the substrate and a cured product of the epoxy resin composition, (iii) polishing part of the cured product, to form a polished surface, and (iv) forming a coating material film or a redistribution layer on the polished surface.

Now, description will be given below of an example case where the epoxy resin composition is used as a compression molding material (encapsulation material) for FOPLP or FOWLP.

Step (i)

An electronic component to be prepared is, for example, a group of individualized semiconductor chips arranged on a resin film. Such a group can be prepared by, for example, dicing a semiconductor wafer into individual pieces, and mounting them on a resin film.

As the epoxy resin composition, a composition containing an epoxy resin, a fused silica possibly containing hollow particles, and a curing agent and/or a curing accelerator is prepared.

Step (ii)

Encapsulation of the electronic component with the epoxy resin composition is carried out, for example, by compression molding. The molding method is not limited to compression molding, and may be printing molding, transfer molding, or application molding using a dispenser or the like. In compression molding, for example, the electronic component and the epoxy resin composition are placed within a die, and the epoxy resin composition is heated under a predetermined pressure. When the epoxy resin composition is cured, an encapsulation body is formed.

There is no particular limitation on the conditions for curing. To allow the curing to proceed sufficiently, it is preferable to perform heating (heating during molding) and post-curing.

The heating (heating during molding) is, although depending on the molding method, preferably carried out at 50 to 200° C., more preferably 70 to 180° C. The duration of the heating is, although depending on the molding method, preferably 1 sec to 120 min, more preferably 3 sec to 30 min.

The post-curing is, although depending on the conditions for heating during molding or others, preferably carried out at 80 to 200° C., more preferably 100 to 180° C. The duration of the post-curing is, although depending on the conditions of heating during molding or others, preferably 10 to 300 min, more preferably 30 to 180 min.

Step (iii)

Next, part of the cured product of the epoxy resin composition is polished, to form a polished surface for forming a redistribution layer thereon. The polishing may be performed either on only one side or on both sides of the encapsulation body. That is, a redistribution layer may be formed on both sides of the encapsulation body, if necessary. It is preferable to polish the cured product until Ra of the polished surface reaches 0.2 μm or less, or further reaches 0.15 μm or less. The polishing may be done by mechanical polishing using a grinding machine, such as a grinder, or chemical polishing.

Step (iv)

On the polished surface, for example, a film of coating material or material for forming a redistribution layer is formed. There is no particular limitation on the method for forming a film of coating material or material for forming a redistribution layer. Examples of the method include roll coating, screen coating, gravure coating, spin coat method, die coat method, and spray coat method. Due to the high flatness of the polished surface, a film of coating material or material for forming a redistribution layer can be formed with uniform thickness easily. By performing dicing after redistribution layer (RDL) formation, bump formation, and other necessary steps, individualized devices (electronic component mounting structures) can be obtained.

A detailed description will be given below of materials constituting the epoxy resin composition.

(Epoxy Resin)

The epoxy resin contained in the epoxy resin composition is not particularly limited, and examples thereof include: bisphenol-type epoxy resin, such as bisphenol A epoxy resin, bisphenol F epoxy resin, bisphenol AD epoxy resin, and bisphenol S epoxy resin; an oligomer mixture in which bisphenol-type epoxy resins are partially condensed; fluorene-type epoxy resin, such as bisphenol fluorene epoxy resin, and biscresol fluorene epoxy resin; naphthalene-type epoxy resin, such as 1,6-bis(2,3-epoxypropoxy)naphthalene; biphenyl-type or tetramethylbiphenyl-type epoxy resin; aminophenol-type epoxy resin, such as triglycidyl-p-aminophenol (p-aminophenol-type epoxy resin); aniline-type epoxy resin, such diglycidyl aniline; toluidine-type epoxy resin, such as diglycidyl ortho-toluidine; glycidyl amine-type epoxy resin, such as diamino diphenylmethane-type epoxy resin (e.g., tetraglycidyl diamino diphenylmethane); alicyclic epoxy resin, such as diepoxylimonene; dicyclopentadiene-type epoxy resin; trimethylolalkane-type epoxy resin, such as trimethylolpropane triglycidyl ether, trimethylolmethane triglycidyl ether, and trimethylolethane triglycidyl ether; polyether-type epoxy resin; silicone-modified epoxy resin; novolac-type epoxy resin; mononuclear aromatic epoxy resins having one benzene ring, such as catechol diglycidyl ether, resorcin diglycidyl ether, phthalic acid diglycidyl ether, 2,5-diisopropylhydroquinone glycidyl ether, and hydroquinone glycidyl ether; and nuclear-hydrogenated products of these epoxy resins. These may be used singly or in combination of two or more kinds. Preferred among them are bisphenol A epoxy resin, bisphenol F epoxy resin, bisphenol AD epoxy resin, naphthalene-type epoxy resin, and novolac-type epoxy resin; more preferred are bisphenol A epoxy resin, bisphenol F epoxy resin, and naphthalene-type epoxy resin; most preferred is naphthalene-type epoxy resin, in terms of moisture resistance. These may be used singly or in combination of two or more kinds.

The content of the epoxy resin in the epoxy resin composition is preferably 1 to 30 mass %, more preferably 3 to 10 mass %, so that a cured product excellent in heat resistance, moisture resistance, and electrical insulating properties can be obtained.

(Fused Silica)

The epoxy resin composition contains a fused silica so that the thermal expansion coefficient of a cured product of the epoxy resin composition can be suppressed low. The fused silica may be spherical fused silica, crushed fused silica, or the like. In terms of flowability, spherical fused silica is preferable. A widely used spherical fused silica is produced by fusing pulverized silica powder in high temperature flames, which is then formed into spheres by means of surface tension.

In spherical fused silica, due to entry of gas while fusing, particles with hollow interiors are produced as a by-product. The particle diameter of the fused silica is one of the factors that affect the diameter of the pores derived from cross sections of the hollow particles on a polished surface obtained by polishing a cured product of the fused silica-containing epoxy resin composition. In view of reducing the diameter of the pores derived from cross sections of the hollow particles, the average particle diameter of the fused silica is preferably 10 μm or less, more preferably 7 μm or less. In view of preventing the epoxy resin composition from becoming highly viscous, as well as increasing the content of the fused silica therein, the average particle diameter of the fused silica is preferably more than 1 μm, more preferably more than 2 μm.

The average particle diameter of the fused silica contained in the epoxy resin composition before curing can be determined as, for example, a particle diameter (D50) at 50% cumulative volume in a volumetric particle size distribution. The average particle diameter (D50) can be measured by a laser diffraction method, using a laser diffraction-type particle size distribution analyzer. From the epoxy resin composition before curing, regardless of its properties, only fused silica can be separated by using a solvent for dissolving an epoxy resin and the like.

In view of reducing the diameter of the pores derived from cross sections of the hollow particles, the maximum particle diameter of the fused silica is preferably 25 μm or less, more preferably 20 μm or less. In the case of using top-cut fused silica, the maximum diameter means the top-cut value.

The particle diameter of the fused silica can be adjusted, for example, by precision classification by means of wind power. Other precision classification, such as fracture classification or wet classification, may be used to selectively exclude particles with large hollow interiors.

The content of the fused silica in the epoxy resin composition is preferably 50 to 95 mass %, more preferably 70 to 90 mass %.

(Curing Agent)

The curing agent contained in the epoxy resin composition may be, for example, an acid anhydride, a phenol resin, or an amine compound.

The acid anhydride is not particularly limited, and examples thereof include phthalic anhydride, hexahydrophthalic anhydride, alkylhexahydrophthalic anhydride (e.g., methylhexahydrophthalic anhydride), tetrahydrophthalic anhydride, alkyltetrahydrophthalic anhydride (e.g., 3-methyltetrahydrophthalic anhydride), trialkyltetrahydrophthalic anhydride, himic anhydride, succinic anhydride, methyl nadic anhydride, trimellitic anhydride, pyromellitic anhydride, methylnorbornane-2,3-dicarboxylic acid. These may be used singly or in combination of two or more kinds.

The phenol resin is, although not particularly limited, preferably phenol novolac resin. Phenol novolac resin is a condensed polymer of phenols or naphthols (e.g., phenol, cresol, naphthol, alkylphenol, bisphenol, terpene phenol) and formaldehyde. Examples of the phenol resin include: phenol novolac resin, cresol novolac resin, alkyl phenol novolac resin (e.g., butyl phenol novolac), biphenyl phenol novolac resin, terpene phenol novolac resin, α-naphthol novolac resin, β-naphthol novolac resin, dicyclopentadiene cresol, polyparavinylphenol, bisphenol A novolac, xylylene-modified novolac, decalin-modified novolac, poly(di-o-hydroxyphenyl)methane, poly(di-m-hydroxyphenyl)methane, and poly(di-p-hydroxyphenyl)methane. Among these, naphthol novolak resin is preferable, in terms of water resistance. These may be used singly or in combination of two or more kinds.

The amine compound is not particularly limited, and examples thereof include tetramethyl-diaminodiphenylmethane, tetraethyl-diaminodiphenylmethane, diethyl dimethyl diaminodiphenylmethane, dimethyl diamino toluene, diamino dibutyl toluene, diamino dipropyl toluene, diaminodiphenyl sulfone, diaminoditolyl sulfone, diethyl diamino toluene, bis(4-amino-3-ethylphenyl)methane, and polytetramethyleneoxide-di-p-aminobenzoate. These may be used singly or in combination of two or more kinds.

The curing agent is preferably used in such an amount that the number of equivalents of the functional group of the curing agent is 0.05 to 1.5 equivalents, more preferably 0.1 to 1.2 equivalents, per one equivalent of the epoxy group. This can improve the curability of the epoxy resin composition and enhance the rigidity of the cured product.

(Others)

The epoxy resin composition may contain, in addition to the epoxy resin, the fused silica, and the curing agent, for example, a curing accelerator, and/or a silane coupling agent. Also, carbon black, a defoaming agent, a leveling agent, a pigment, a stress-reducing agent, a pre-gelling agent, an ion catcher, or the like may be added in an appropriate amount, according to the purpose.

The curing accelerator is not particularly limited, and examples thereof include an imidazole-based curing accelerator, a phosphorus-based curing accelerator, an amine-based curing accelerator, an organic metal compound, a phosphonium salt-based curing accelerator, bicyclic amidines and derivatives thereof, an organic metal compound or organic metal complex, and a urea-modified polyamine. The curing accelerator is preferably a latent curing accelerator. Examples of the latent curing accelerator include imidazole-based curing accelerator, phosphorus-based curing accelerator, amine-based curing accelerator, and microcapsule-type curing accelerator. In the case of using a curing accelerator, the curing accelerator is blended in an amount preferably 0.1 to 40 parts by mass, more preferably 1 to 30 parts by mass, relative to 100 parts by mass of the epoxy resin.

Examples of the imidazole-based curing accelerator include: imidazole; 2-substituted imidazole compounds, such as 2-methylimidazole, 2-ethylimidazole, 1-isobutyl-2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, and 1-cyanoethyl-2-phenylimidazole; trimellitates, such as 1-cyanoethyl-2-undecylimidazolium trimellitate, and 1-cyanoethyl-2-phenylimidazolium trimellitate; triazine adducts, such as 2,4-diamino-6-[2'methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine; 2,4-diamino-6-[2'-methylimidazolyl-(1')]-ethyl-s-triazine isocyanuric acid adduct, 2-phenylimidazole isocyanuric acid adduct, 2-methylimidazole isocyanuric acid adduct, 2-phenyl-4,5-dihydroxymethylimidazole, and 2-phenyl-4-methyl-5-dihydroxymethylimidazole.

Examples of the phosphorus-based curing accelerator include: trialkylphosphine compounds, such as tributylphosphine; and triarylphosphine compounds, such as triphenylphosphine.

Examples of the amine-based curing accelerator include 2,4,6-tris(dimethylaminomethyl)phenol, diethylamine, triethylamine, diethylenetetramine, triethylenetetramine, and 4,4-dimethylaminopyridine. The amine-based curing accelerator may be an amine adduct.

Examples of the organic metal compound or organic metal complex include zinc naphthenate, cobalt naphthenate, tin octylate, cobalt octylate, bis(acetylacetonate)cobalt (II), and tris(acetylacetonate)cobalt(III).

The microcapsule-type curing accelerator may be, for example, a fine particle composition comprising an amine compound powder dispersed in an epoxy resin. The amine compound can be selected depending on the desired viscosity increase ratio. Examples of the amine compound include an aliphatic primary amine, an alicyclic primary amine, an aromatic primary amine, an aliphatic secondary amine, an alicyclic secondary amine, an aromatic secondary amine, an imidazole compound, an imidazoline compound, and reaction products of these compounds and a carboxylic acid, a sulfonic acid, an isocyanate or an epoxy compound. These may be used singly or in combination of two or more kinds. For example, an aliphatic primary amine, an alicyclic primary amine, an aromatic primary amine, an aliphatic secondary amine, an alicyclic secondary amine, an aromatic secondary amine, an imidazole compound, or an imidazoline compound may be used in combination with a reaction product as mentioned above. The amine compound powder preferably has an average particle diameter of 50 μm or less, more preferably 10 μm or less. Likewise, as above, the average particle diameter can be determined as a particle diameter (D50) at 50% cumulative volume in a volumetric particle size distribution. The amine compound powder preferably has a melting point or softening point of 60° C. or higher, in view of preventing increase in viscosity at room temperature or 25° C.

The silane coupling agent is added so that it reacts with the surface of the fused silica, and thus enhances the dispersibility of the fused silica in the epoxy resin composition. Examples of the silane coupling agent include 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, and vinyltriethoxysilane. These may be used singly or in combination of two or more kinds. In the case of using a silane coupling agent, the silane coupling agent is blended in an amount preferably 0.05 to 5 parts by mass, more preferably 0.1 to 3 parts by mass, relative to 100 parts by mass of the fused silica.

(Preparation of Epoxy Resin Composition)

The epoxy resin composition is prepared by blending the components each in a predetermined ratio, followed by stirring for, example, 60 to 480 min. This is followed by defoaming under reduced pressure. The epoxy resin composition may be in the form of liquid or sheet, or in a semi-cured state.

(Coating Material)

The coating material to be formed into a film on a polished surface by application or other methods has no particular limitation, and may be selected depending on the purpose of a cured product of the epoxy resin composition. When the epoxy resin composition is used as an encapsulation material for FOWLP or FOPLP, a material for forming a redistribution layer may be, for example, a material for forming a surface protective film. Examples of the material for forming a surface protective film include photosensitive polyimide, and photosensitive polybenzoxazole. A film of the material for forming a redistribution layer may be formed by any method. Examples of the method include a spin coating method, a die coating method, a spray coating method, and a method of applying a material for forming a redistribution layer onto a polished surface by, for example, dipping, ink jetting, screen printing, or jet dispensing. After the film is formed, through exposure, development, etching, and other treatments, a redistribution layer is formed. Optionally, a seed layer (e.g., Cu) may be formed on a polished surface by sputtering or electroless plating, followed by pattern formation, into a redistribution layer. The redistribution layer may be, for example, Cu, a Cu alloy, Al, or an Al alloy.

EXAMPLES

The present invention will be specifically described below with reference to Examples and Comparative Examples. The present invention, however, is not limited to the following Examples.

Example 1

(1) Preparation of Epoxy Resin Composition

The followings were mixed and stirred for 120 min. The mixture was defoamed under reduced pressure, into an epoxy resin composition.

<Epoxy Resin>100 Parts by Mass

Bisphenol A epoxy resin (RE-310 available from Nippon Kayaku Co., Ltd., epoxy equivalent: 184 g/eq)

<Curing Agent>100 Parts by Mass

Methyltetrahydrophthalic anhydride (available from Hitachi Chemical Co., Ltd., acid anhydride equivalent: 164 g/eq)

<Curing Accelerator>6 Parts by Mass

Amine adduct-based latent curing accelerator (AJICURE PN-23 available from Ajinomoto Co., Ltd.)

<Silane Coupling Agent>3 Parts by Mass 3-glycidoxypropyltrimethoxysilane

<Carbon Black>1 Part by Mass

2600 available from Mitsubishi Chemical Corporation

<Fused Silica A>1500 Parts by Mass

Fused silica A used here had been subjected to precision classification to remove as many hollow particles as possible therefrom and to have a maximum particle diameter of 20 µm or less and an average particle diameter of 4.5 µm. The maximum particle diameter and the average particle diameter were measured by a laser diffraction method using a laser diffraction-type particle size distribution analyzer.

(2) Preparation of Test Piece

The epoxy resin composition prepared in (1) was applied onto a plurality of individualized semiconductor chips (thickness: 1 mm) arranged on a resin film, and cured by compression molding. In the compression molding, heating was performed at 125° C. for 10 min, and post-curing was performed at 150° C. for 1 hour.

(3) Polishing of Test Piece

The surface of a cured product of the test piece prepared in (2) was polished by a grinder, to form a polished surface.

(4) Evaluation

The polished surface of the cured product of the test piece obtained in (3) was measured using an ultra-deep color 3D profile measuring microscope (VK-9510 available from Keyence Corporation). The image of the polished surface is shown in FIG. 1. In randomly selected 10 areas each measuring 25 mm$^2$ on the polished surface, the diameters and the number of the pores derived from cross sections of the hollow particles were measured. The numbers of pores whose diameter was greater than 1.5 µm and equal to or less than 5 µm, pores whose diameter was greater than 5 µm and equal to or less than 10 µm, and pores whose diameter was greater than 10 µm were each measured and averaged. The results are shown in Table 1.

With respect to an area with low flatness (rough area) where surface roughness was caused by pores, the largest pore among those observed within the area was measured for its diameter and depth, and the hollow particle having that pore was measured for its particle diameter, to determine arithmetical mean roughness (Ra), maximum peak (Ry), and ten-point mean roughness (Rz) of the polished surface. The sampling length was 100 µm. Likewise, with respect to a pore-free area with high flatness (flat area), arithmetical mean roughness (Ra), maximum peak (Ry), and ten-point mean roughness (Rz) were determined. The results are shown in Table 2.

In addition, a photosensitive polyimide resin was applied on the polished surface by spin coating, and exposed to light to form a cured film (film thickness after curing: 5 µm). The surface of the cured film was observed under an electron microscope (magnification: 100×).

Example 2

Figure 2:
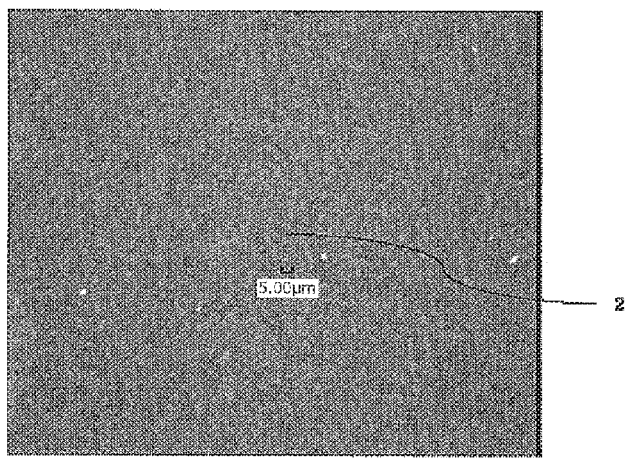
FIG. 2 An image of a polished surface obtained in Example 2, taken using an ultra-deep color 3D profile measuring microscope, showing pores derived from cross sections of hollow particles.

An epoxy resin composition was prepared in the same manner as in Example 1, except that fused silica B was used as the fused silica, and a test piece was prepared. Fused silica B had been subjected to precision classification to remove as many hollow particles as possible therefrom and to have a maximum particle diameter of 10 µm or less and an average particle diameter of 3 µm. The image of the polished surface is shown in FIG. 2, and the evaluation results are shown in Tables 1 and 2.

Example 3

Figure 3:
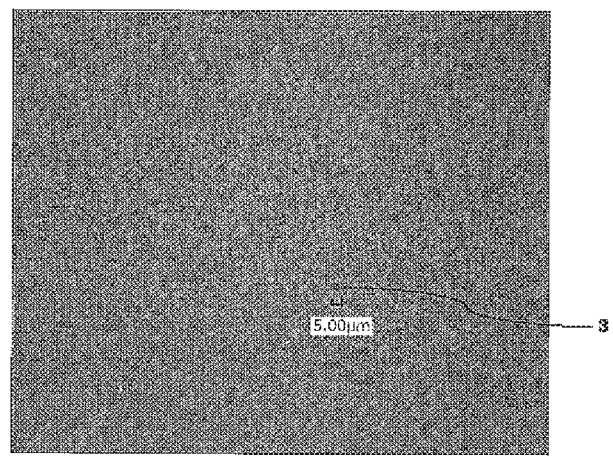
FIG. 3 An image of a polished surface obtained in Example 3, taken using an ultra-deep color 3D profile measuring microscope, showing pores derived from cross sections of hollow particles.

An epoxy resin composition was prepared in the same manner as in Example 1, except that fused silica C was used as the fused silica, and a test piece was prepared. Fused silica C had been subjected to precision classification by means of wind power to remove as many hollow particles as possible therefrom and to have a maximum particle diameter of 10 µm or less and an average particle diameter of 2 µm. The image of the polished surface is shown in FIG. 3, and the evaluation results are shown in Tables 1 and 2.

Comparative Example 1

Figure 4:
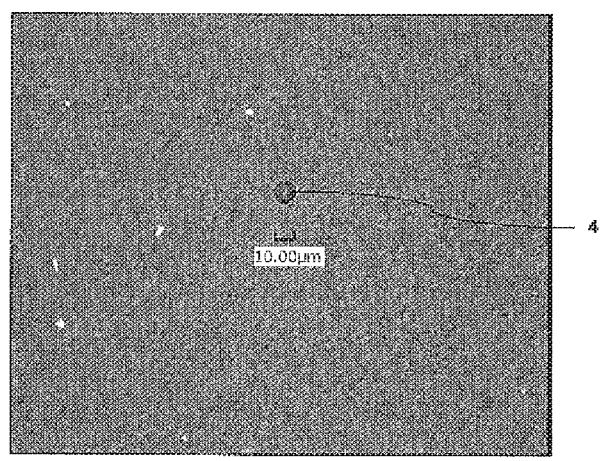
FIG. 4 An image of a polished surface obtained in Comparative Example 1, taken using an ultra-deep color 3D profile measuring microscope, showing pores derived from cross sections of hollow particles.

An epoxy resin composition was prepared in the same manner as in Example 1, except that fused silica D was used as the fused silica, and a test piece was prepared. Fused silica D had a maximum particle diameter of 25 µm or less and an average particle diameter of 7 µm. The image of the polished surface is shown in FIG. 4, and the evaluation results are shown in Tables 1 and 2.

Comparative Example 2

Figure 5:
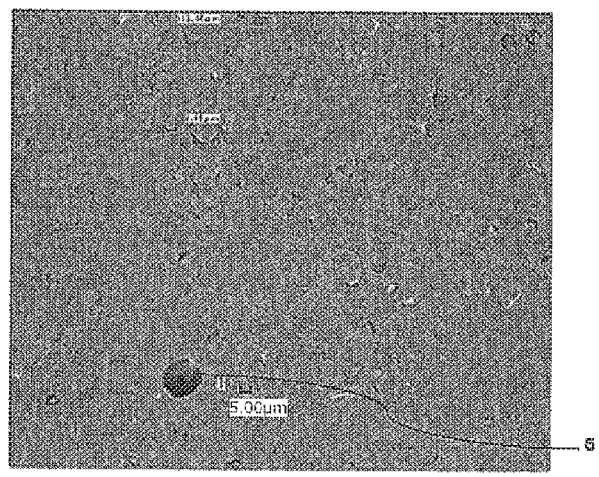
FIG. 5 An image of a polished surface obtained in Comparative Example 2, taken using an ultra-deep color 3D profile measuring microscope, showing pores derived from cross sections of hollow particles.

An epoxy resin composition was prepared in the same manner as in Example 1, except that fused silica E was used as the fused silica, and a test piece was prepared. Fused silica E had a maximum particle diameter of 75 µm or less and an average particle diameter of 20 µm. The image of the polished surface is shown in FIG. 5, and the evaluation results are shown in Tables 1 and 2.

Comparative Example 3

Figure 6:
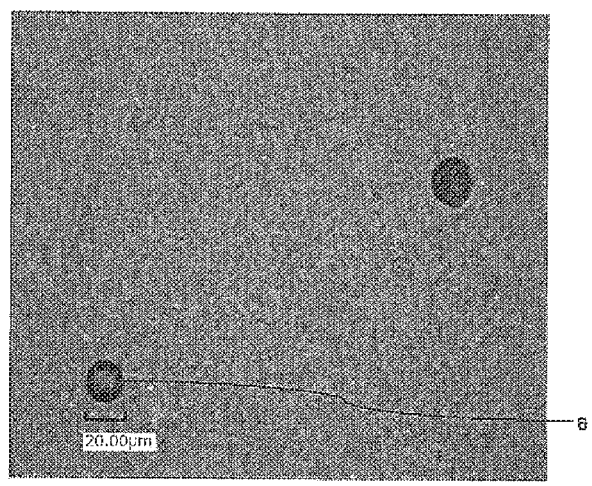
FIG. 6 An image of a polished surface obtained in Comparative Example 3, taken using an ultra-deep color 3D profile measuring microscope, showing pores derived from cross sections of hollow particles.

An epoxy resin composition was prepared in the same manner as in Example 1, except that fused silica F was used as the fused silica, and a test piece was prepared. Fused silica F is fused silica C before subjected to precision classification. Fused silica F had a maximum particle diameter of 45 µm or less and an average particle diameter of 2 µm. The image of the polished surface is shown in FIG. 6, and the evaluation results are shown in Tables 1 and 2.

TABLE 1

|  | Ex. 1 | Ex. 2 | Ex. 3 | Com. Ex. 1 | Com. Ex. 2 | Com. Ex. 3 |
|---|---|---|---|---|---|---|
| Fused silica | A | B | C | D | E | F |
| Maximum diameter (μm) | ≤20 | ≤10 | ≤10 | ≤25 | ≤75 | ≤45 |
| Average diameter (μm) | 4.5 | 3 | 2 | 7 | 20 | 2 |
| Pores derived from cross sections of hollow particles (pores/25 mm²) 10 μm < dia. | 0 | 0 | 0 | 2 | 24 | 6 |
| 5 μm < dia. ≤ 10 μm | 0 | 0 | 0 | 3 | 8 | 4 |
| 1.5 μm < dia. ≤ 5 μm | 14 | 2 | 1 | 8 | 0 | 5 |

TABLE 2

|  |  | Diameter of hollow particle (μm) | Diameter of pore (μm) | Depth of pore (μm) | Ra (μm) | Ry (μm) | Rz (μm) |
|---|---|---|---|---|---|---|---|
| Ex. 1 | Rough area | 12.4 | 4.1 | 3.6 | 0.31 | 3.74 | 3.55 |
|  | Flat area | — | — | — | 0.08 | 0.35 | 0.18 |
| Ex. 2 | Rough area | 6.0 | 1.8 | 1.5 | 0.13 | 1.8 | 0.53 |
|  | Flat area | — | — | — | 0.14 | 0.42 | 0.32 |
| Ex. 3 | Rough area | 7.2 | 3.1 | 1.1 | 0.16 | 1.58 | 0.81 |
|  | Flat area | — | — | — | 0.09 | 0.55 | 0.43 |
| Com. Ex. 1 | Rough area | 16.3 | 11.3 | 5.6 | 0.86 | 5.91 | 5.67 |
|  | Flat area | — | — | — | 0.15 | 0.81 | 0.20 |
| Com. Ex. 2 | Rough area | 61.3 | 23.9 | 13.9 | 4.79 | 23.86 | 16.23 |
|  | Flat area | — | — | — | 0.03 | 1.0 | 1.0 |
| Com. Ex. 3 | Rough area | 23.5 | 18.0 | 9.3 | 2.37 | 9.96 | 9.96 |
|  | Flat area | — | — | — | 0.09 | 1.06 | 0.76 |

As shown in FIGS. 1, 2, and 3, pores derived from cross sections of the hollow particles were observed on the polished surfaces of the test pieces of Examples 1, 2 and 3. The observed pores in these examples, however, were 5 μm or less in diameter. Due to the absence of pores having a diameter larger than 5 μm, the flatness of the polished surfaces was very high as shown in Table 2. The observation confirmed that the surfaces of the cured films of the photosensitive polyimide resin formed on the polished surfaces also had high flatness.

In Comparative Examples 1, 2 and 3, pores of 10 μm or less in diameter were present on the polished surface of the test pieces; in particular, in Comparative Examples 1 and 3, pores of 5 μm or less in diameter were also observed. On the other hand, pores larger than m in diameter were present, too, as shown in FIGS. 4, 5 and 6. Therefore, the flatness of the polished surfaces was low as shown in Table 2. The observation found dents on the surfaces of the cured films of the photosensitive polyimide resin formed on the polished surfaces, which confirmed that the flatness was low.

INDUSTRIAL APPLICABILITY

With the epoxy resin composition according to the present invention, when a cured product thereof is polished, a polished surface with high flatness can be obtained, making it possible to form a fine redistribution layer on the polished surface. The epoxy resin composition according to the present invention is useful as an encapsulation material for fan-out wafer level package (FOWLP) and fan-out panel level package (FOPLP).

REFERENCE SIGNS LIST

1: Pore derived from cross section of hollow particle observed in Example 1.
2: Pore derived from cross section of hollow particle observed in Example 2.
3: Pore derived from cross section of hollow particle observed in Example 3.
4: Pore derived from cross section of hollow particle observed in Comparative Example 1.
5: Pore derived from cross section of hollow particle observed in Comparative Example 2.
6: Pore derived from cross section of hollow particle observed in Comparative Example 3.

The invention claimed is:

1. An epoxy resin composition, comprising
an epoxy resin, a spherical fused silica possibly containing hollow particles, and a curing agent, wherein
the curing agent includes an acid anhydride,
the epoxy resin composition is in a form of a liquid or sheet,
the content of the fused silica in the epoxy resin composition is 70 to 90 mass %,
the fused silica has a maximum particle diameter of 25 μm or less, and an average diameter of more than 1 μm and less than 3 μm, and
on a polished surface obtained by polishing a cured product of the epoxy resin composition, the number of pores having a diameter of more than 5 μm observed within a 25-mm² area is one or less, the pores derived from cross sections of the hollow particles.

2. The epoxy resin composition of claim 1, wherein the number of pores having a diameter of more than 2 μm observed within the 25-mm² area is one or less, the pores derived from cross section of the hollow particles.

3. The epoxy resin composition of claim 1, wherein the fused silica has a maximum particle diameter of 20 μm or less.

4. The epoxy resin composition of claim 1, wherein a redistribution layer is formed on the polished surface.

5. The epoxy resin composition of claim 1, wherein the cured product is a cured product formed by thermally curing the epoxy resin composition at 150° C. for one hour.

6. The epoxy resin composition of claim 1, the epoxy resin composition being a material for compression molding for fan-out panel level packaging or fan-out wafer level packaging.

7. An electronic component mounting structure comprising
- an electronic component, and
- a cured product of an epoxy resin composition, the cured product encapsulating the electronic component, wherein:
- the epoxy resin composition contains an epoxy resin, a spherical fused silica possibly containing hollow particles, and a curing agent;
- the curing agent includes an acid anhydride,
- a content of the fused silica in the epoxy resin composition is 70 to 90 mass %,
- the fused silica has a maximum particle diameter of 25 μm or less, and an average diameter of more than 1 μm and less than 3 μm,
- the cured product has a polished surface; and
- on the polished surface, the number of pores having a diameter of more than 5 μm observed within a 25-mm$^2$ area is one or less, the pores derived from cross sections of the hollow particles.

8. The electronic component mounting structure of claim 7, wherein a redistribution layer is formed on the polished surface.

9. A method of producing an electronic component mounting structure, the method comprising steps of:
- preparing an electronic component, and an epoxy resin composition;
- encapsulating the electronic component with the epoxy resin composition, and curing the epoxy resin composition by compression molding, to form an encapsulation body including the electronic component and a cured product of the epoxy resin composition;
- polishing part of the cured product, to form a polished surface; and
- forming a redistribution layer on the polished surface,
- wherein the epoxy resin composition comprises
- an epoxy resin, a spherical fused silica possibly containing hollow particles, and a curing agent, wherein
- the epoxy resin composition is in a form of a liquid or sheet,
- a content of the fused silica in the epoxy resin composition is 70 to 90 mass %,
- the fused silica has a maximum particle diameter of 25 μm or less, and an average diameter or more than 1 μm and less than 3 μm, and
- on a polished surface obtained by polishing a cured product of the epoxy resin composition, the number of pores having a diameter of more than 5 μm observed within a 25-mm$^2$ area is one or less, the pores derived from cross sections of the hollow particles.

* * * * *